United States Patent [19]

Manly

[11] 4,371,742
[45] Feb. 1, 1983

[54] EMI-SUPPRESSION FROM TRANSMISSION LINES

[75] Inventor: William A. Manly, Arlington, Tex.

[73] Assignee: Graham Magnetics, Inc., North Richland Hills, Tex.

[21] Appl. No.: 59,047

[22] Filed: Jul. 19, 1979

Related U.S. Application Data

[63] Continuation of Ser. No. 862,342, Dec. 20, 1977, abandoned.

[51] Int. Cl.$^3$ ............................................. H01B 11/06
[52] U.S. Cl. ................................. 174/36; 174/35 MS;
    252/62.56; 333/243; 343/18 A
[58] Field of Search ........................ 174/36, 35 MS;
    343/18 A; 333/243, 244, 12; 252/62.51, 62.54,
    62.55, 62.56; 106/290

[56] References Cited

U.S. PATENT DOCUMENTS

| | | | |
|---|---|---|---|
| 2,879,318 | 3/1959 | Straube | 174/36 |
| 3,541,473 | 11/1970 | Schlicke et al. | 333/243 |
| 3,573,676 | 4/1971 | Mayer | 333/243 X |
| 3,594,492 | 7/1971 | Bahder | 174/36 |
| 3,622,432 | 11/1971 | McCluer | 174/35 MS |
| 3,666,876 | 5/1972 | Forster | 174/36 |
| 3,843,593 | 10/1974 | Shell et al. | 252/62.56 X |
| 3,938,152 | 2/1976 | Grimes et al. | 343/18 A |
| 4,003,840 | 1/1977 | Ishino et al. | 343/18 A X |
| 4,006,479 | 2/1977 | La Combe | 343/18 A |
| 4,116,906 | 9/1978 | Ishino et al. | 252/62.56 X |

FOREIGN PATENT DOCUMENTS

| | | | |
|---|---|---|---|
| 2050913 | 4/1972 | Fed. Rep. of Germany | 174/36 |
| 495466 | of 1938 | United Kingdom | 174/35 MS |

*Primary Examiner*—B. A. Reynolds
*Assistant Examiner*—Philip H. Leung
*Attorney, Agent, or Firm*—Andrew F. Kehoe

[57] ABSTRACT

Absorptive shields for transmission lines, especially those tending to radiate electromagnetic wave lengths within a frequency range of from about $10^6$ to about $10^{10}$ hertz, especially $10^7$ to $10^{10}$ hertz. The shields are flexible materials filled with ferromagnetic, or ferrimagnetic, powders of selected particle size and distribution.

48 Claims, 5 Drawing Figures

EMI-SUPPRESSION FROM TRANSMISSION LINES

This is a continuation of application Ser. No. 862,342 filed 12/20/77, abandoned.

BACKGROUND OF THE INVENTION

This invention relates to transmission wires and means to equip them with effective electromagnetic shielding jackets.

Most elementary treatments of transmission line theory, relating to such transmission lines as coaxial and balanced shielded lines, assume the use of an outer conductor (shield) which is continuous, homogenous, and of sufficient thickness to assure no electrical current flows on the outer surface of the outer conductor as the result of electrical currents and magnetic fields within the transmission line.

In fact, none of these assumptions are strictly true and, in many applications, significant radiation emits from shielded transmission lines, e.g. because of insufficient thickness or gaps in the outer conductor. In general, lines that leak electromagnetic energy also have a tendency to pick up interfering signals. These two effects together tend to contribute to what has become recognized as a growing electromagnetic interference (EMI) problem.

Desirable solutions to these problems should provide improved shielding while maintaining flexibility and, desirably, very little increase in diameter of the transmission line or in cost of the line. Double-shielded lines do not meet these criteria well, albeit they markedly reduce emissions and find important use in many applications which can tolerate the increased diameter and cost together with the decrease in flexibility.

Thus, the shielded products available on the market tend to be cables with woven wire shields, aluminum foil shields or those embodying electroconductive tubing or conduits. Such products are expensive, or lack flexibility, or have larger diameters than would be desirable.

Other workers in the prior art have paid general attention to the problem of particular electromagnetic shielding applications by adding conductive powders to organic polymers to form electrically-conductive composites. Such materials are disclosed in U.S. Pat. No. 4,011,360 (noble metal in siloxane polymer). Non-conductive composites using metal powders generally to reflect microwave radiation have also been proposed (U.S. Pat. No. 2,951,247). Indeed, a great deal of art has been proposed for providing metal-filled composites for use in such products as microwave gaskets and the like (U.S. Pat. No. 3,746,530 discloses some such products). It should be noted that at about the microwave oven radiation frequencies, ferromagnetic powders lose their ferromagnetic character, although they do remain electroconductive.

Nevertheless, it has remained a problem to provide a suitable shielded transmission line which is at once low cost, flexible, and yet excellently shielded.

It is to be noted that the above statement of the prior art necessarily has been prepared with a hindsight view of the invention. Thus, this statement should not be construed as evidencing the state of the art as it may have appeared to one skilled in the art before the invention was made.

SUMMARY OF THE INVENTION

Therefore it is a principal object of the invention to provide flexible transmission lines having improved EMI characteristics, in the frequency range of $10^6$ to $10^{10}$ hertz.

Another object of the invention is to provide improved electromagnetic shielding compositions which are useful in flexible configurations of such structures as antennae and transmission lines.

A specific object of the invention is to provide improved transmission of transmission lines having a metallic shielding structure.

Still another object of the invention is to provide shielding compositions of excellent EMI absorbtion characteristics which compositions are not electroconductive.

Other objects of the invention relate to providing a process for making and operating the novel compositions and transmission lines described above.

Another object of the invention is to provide means to shield electronic devices from incident radiation or to shield the environment of such devices from radiation emitted therefrom and novel devices bearing such radiation-absorbent coatings.

A further object of the invention is to provide means to shield radiation-free rooms and the like and, in particular, to provide a flexible shield means having an improved shielding capability over an extended period of time.

Still additional objects of the invention will be apparent to those skilled in the art on their reading of the present invention.

The above objects have been substantially achieved by utilizing electromagnetic shielding compositions comprising ferromagnetic metal particles which are carefully selected with respect to their particle size and with respect to the particular wave length of EMI which they are to absorb. These shielding compositions are arranged around the exterior of the outer metal shields presently used on such transmission lines.

It is also to be noted that the shielding compositions of the invention also can be used in antenna manufacture and fine-tuning of antennae. Thus, for example, parasitic signal pickup can be minimized by use of the power-absorbing coatings comprising the composition of the invention.

Suitable particles for use in this invention are ferromagnetic iron, nickel, cobalt, ferromagnetic alloys based on these metals, and the like. Ferrimagnetic as well as ferromagnetic particles are useful; however, use of the former is not usually preferred, as will be explained below. Iron and nickel powders, or alloys thereof, are preferred. The total metal volume of the power-absorbing compositions of the invention is usually between 45% and 65%.

Particle sizes are given below in terms of their maximum dimension. Thus, for example, the maximum dimension is the diameter if the particle is a sphere, but if the particle is acicular, the maximum dimension would be along its axis.

| Frequency of Radiation (Hertz) | Range of Particle Maximum Dimention in Micrometers | Average Particle Maximum Dimension in Micrometers | Approximate Recommended Shield Thickness (inches) |
|---|---|---|---|
| $10^7$ to $10^8$ | 160 to 500 | 280 | 0.050 |
| $10^8$ to $10^9$ | 50 to 160 | 90 | 0.018 |
| $10^9$ to $10^{10}$ | 16 to 50 | 38 | 0.0075 |

The shield thickness, when applied to embodiments of the invention whic utilize two concentric insulation layers includes the total thickness of those layers.

Above about $10^{10}$ hertz metals do not exhibit appropriate ferromagnetic characteristics. Below $10^6$ hertz the invention is not generally useful. In a range of from about $10^6$ hertz to about $10^7$ hertz, the same particles recommended for the $10^7$ hertz to $10^8$ hertz shielding are useful, but the efficiency of absorption falls off as the frequency drops below about $10^7$ hertz.

It is advantageous if the volume conductivity of the power-absorption layer of the invention is adjusted so that the "skin-depth factor", sometimes referred to as "skin depth" or "skin thickness" is of the same order of magnitude as, i.e. from 0.2 to 5 times the total thickness of the layer. However, most advantageous skin depths are at least about 0.5 the total thickness of the layer. Such a conductivity adjustment is readily made by those skilled in the art of making conductive paints by merely adjusting the particle volume concentration (PCV) and/or the mixing work input (during preparation) of the particle-bearing composite. The average maximum particle size in micrometers divided by the shield in inches incorporating the particles is advantageously about 5000.

The process of the invention is of particular value when utilized with relatively short transmission lines; i.e. lines of from about one foot to about 30 meters in length and wherein the electromagnetic radiation to be shielded is such that a half-wavelength of the radiation is about 1/6 or more of the line length. In such a situation, the closer the line length to being an even multiple of half the wavelength of the radiation to be absorbed, the greater the relative shielding advantage of the process and the products of the invention compared to previously known shielding systems.

It is to be noted further that the reduction in Q values for current in the outer metal conductor drops by a factor of at least about 5, advantageously about 10 or more, when one utilized the invention taught herein.

It is believed to be highly advantageous, in order to improve the long term performance of the compositions of the invention to provide protective coatings on such metal particles as iron, nickel, and cobalt. Very suitable powders are available from the Cobaloy Division of Graham Magnetics, Inc. These comprise an ultra-thin conductive and ceramic coating which is very effective in providing resistance to corrosion as the result of, e.g. moisture, or $H_2S$ atmospheres. Other protective coatings can be utilized; however, care should be taken that they do not interfere with the dispersability or loading characteristics of the metal. It is also preferable that such coatings be electrically conductive.

The ferrmagnetic materials used in the invention are advantageously so-called magnetically "soft" ferrites, e.g. those sold under the Ceramag 7D, 7B, 24B, or 24 designation by the Stackpole Carbon Company. These materials are conveniently loaded into a resin matrix to about 80% by weight, usually from about 40% to 45% by volume. Unlike the ferromagnetic materials, there does not appear to be an important dependency between particle size and wavelength of the radiation to be absorbed when one used ferrimagnetic materials. This is assignable, probably, to the fact that the ferrimagnetic materials absorb the electromagnetic energy largely by wall friction effects between magnetic domains. The ferromagnetic materials, on the other hand, are believed to have a dual character whereby they absorb energy both by maximizing eddy current losses within each particle and also within the total composite coating. Another disadvantage of the soft ferrites is that each ferrite tends to have a rather narrow range of frequencies with which it can be used to advantage. Nevertheless, very favorable products may be prepared using ferrimagnetic-particle-in-resin compositions on transmission cables and, in a proper case, the total thickness of the shielding composition can be cut to about 90% of the thickness used with appropriate ferromagnetic materials.

A good discussion of Q values, i.e. quality factors, is to be found in an article by Rose-Innes in the International Journal of Electrical Engineering Education, Volume 13 pp 119-122. Also, a discussion of skin depth is found in Electronic and Radio Engineering, Fourth Edition by Terman (McGraw-Hill, New York, 1955). Another useful reference on these matters is found in Electrical Engineering Circuits by Skilling (Wiley, 1957).

In general, the optimum maximum particle dimensions of iron, nickel and the like are approximately as follows for various wavelengths:

| Frequency | Approximate Particle Size (Maximum Dimension) in meters |
|---|---|
| $10^6$ hertz | 0.0015 |
| $10^7$ hertz | 0.0005 |
| $10^8$ hertz | 0.00015 |
| $10^9$ hertz | 0.00005* |

*iron is preferred to nickel in this range because the frequencies are closer to the transition of nickel to a non-magnetic material.

Typical shielding applications for various wavelengths are disclosed as follows:

| Frequency | Typical Application |
|---|---|
| $10^6$ hertz | normal radio broadcast |
| $10^7$ hertz | shortwave radio |
| $10^8$ hertz | VHF television |
| $5 \times 10^8$ hertz | UHF television |

Although there is a particular value to application of the radiation-absorbing materials of the invention to transmission like structures, they can also be used on other structures which tend to emit, or conversely require protection from, troublesome electromagnetic radiation. Among such devices are all types of radio senders and receivers in the $10^6$ through $10^9$ range. "Radio" is used in the general sense here. For example, many radios or other electronic equipment can, if used on aircraft, interfere with radio signals desirably received or emitted by the aircraft to facilitate the proper control and direction thereof. Also, constructing radiation-free environments can be facilitated by use of the radiation-absorbing materials of the invention as barriers to form the equivalent of what was once known as "screen rooms", i.e. areas bordered with copper screens to intercept incipient radiation. Indeed, the materials of the invention are particularly valuable for such purposes because they can be selected to be of optimum, and improved, energy-absorbing efficiency at a specific wavelength.

Moreover, they are readily flexible (as in an absorbent composition on Mylar film) to form a temporary or window-shade like structure which can be "drawn" only when required. Indeed such a rollable or removable structure can find important utility over required openings in shielded equipment where the bulk of shielding may be supplied by metal structures, such as casings, in which the opening is necessary.

ILLUSTRATIVE EMBODIMENT OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as maybe best suited in the condition of a particular case.

IN THE DRAWINGS

EXAMPLE 1

A quantity of 87.5 parts by weight of an iron powder of the type available under the trade designation Cobaloy 605 from the Cobaloy Company division of Graham Magnetics, Inc. was mixed with 12.5 parts of a polyurethane binder sold by Goodrich Chemicals Co. under the trade designation Estane 5707. The iron powder was characterized by a thin layer of ohmic iron carbide thereover.

Tetrahydrofuran was utilized as a solvent vehicle in forming this mixture and thinning it to an appropriate coating viscosity in a Cowles dissolver, a conventional piece of processing apparatus.

The resulting material was coated to a dry thickness of about 0.009 inches on each side of a 0.001 inch thick film of polyester substrate, i.e. the biaxially-oriented material sold by DuPont under the trade designation MYLAR. The coated web was dried and slit to a 0.5 inch width and then wound helically onto the outer metallic shield of several coaxial transmission lines characterized by an outer shield diameter of about 0.125 inch. Several lines of different impedance characteristic/different diameter were tested, all yielded similar test results.

The effectiveness of the EMI shielding was tested utilizing a 66 megahertz RF current to flow through a 6 inch section of the line:
Q prior to shielding: 130
Q with shielding: 22.5

Thus 80% of the radiated power was absorbed.

Figure 1:
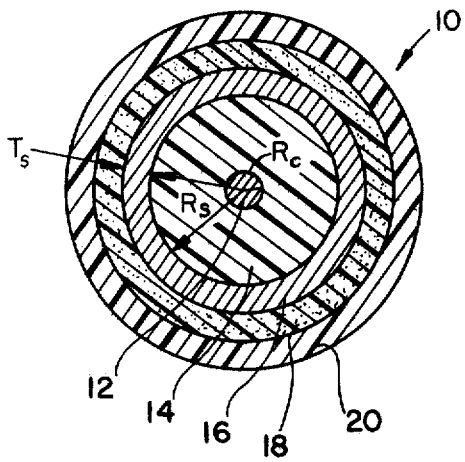
FIG. 1 is a schematic in section of an electrical transmission line constructed according to the invention.

A transmission line 10 of the type disclosed above is shown in FIG. 1. It comprises an inner conductor 12 of the radius $R_c$, an inner dielectric material 14 such as polyethylene, and a metallic shield 16 having a shield thickness $T_s$ and an inner radius of $R_s$ and forming an outer conductor.

Around the exterior of the outer conductor is the EMI-ameliorating web 18 described above, i.e. a polyester-carried layer of ferromagnetic particles of selected size within a matrix. A protective jacket of a material like polyethylene 20 is usually extruded over the finished web.

EXAMPLE 2

A particulate mixture was prepared using the iron powder of Example 1 and some nickel powder as follows:

|  | Parts by Weight | Average Maximum Particle Dimension |
|---|---|---|
| Iron −100 +200 mesh | 55 | 275 micrometers |
| Iron −200 +325 mesh | 25 | 56 micrometers |
| Iron −325 mesh | 5 | 40 micrometers |
| Nickel (size) | 15 | 22 micrometers |

The larger sized powder was that most desirable according to the teachings of the invention. Some smaller-sized particles were added for two purposes: (1) to increase the power-absorption frequency range of the composition and (2) to adjust conductivity to meet the desired relationship of conductivity and thickness.

The nickel was that sold under the trade designation Cobaloy 830 by the Cobaloy Company division of Graham Magnetics, Inc. It, also, is a nickel powder with a chemically protective and ohmic coating thereon. The particles were milled, using a rubber mill, into a blend of rubber and other polymeric matrix material. Thereupon the resulting material was removed from the mill as a sheet 0.015 inches thick containing about 53% by volume of the metal particles.

This material was tested according to the test procedure disclosed in Example 1. Absorbed power was 87.7% as indicated by a Q test value of 16.

EXAMPLE 3

A composition was prepared according to the teachings of Example 1 using a soft ferrimagnetic powder sold under the trade designation Ceramag 7D (Stackpole Carbon Company). The material was loaded into a matrix to about 45% by volume, and coated on the wire at about 80% of the thickness described in Example 1. The resulting transmission line has greatly improved electromagnetic radiation absorbing characteristics.

Figure 2:
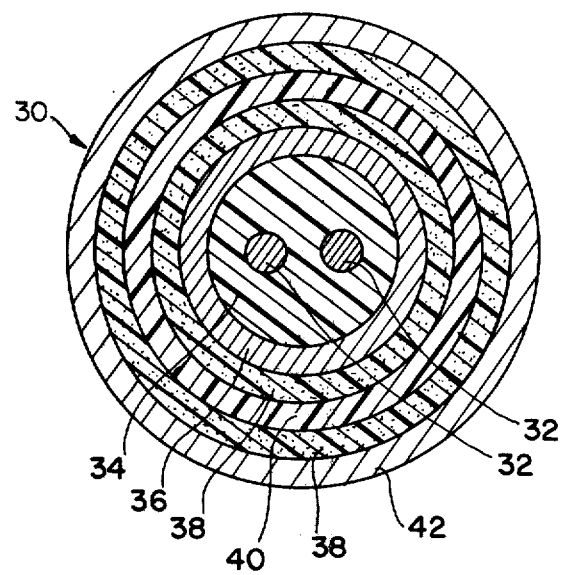
FIG. 2 is a schematic in section of another transmission line constructed according to the invention.
Figure 3:
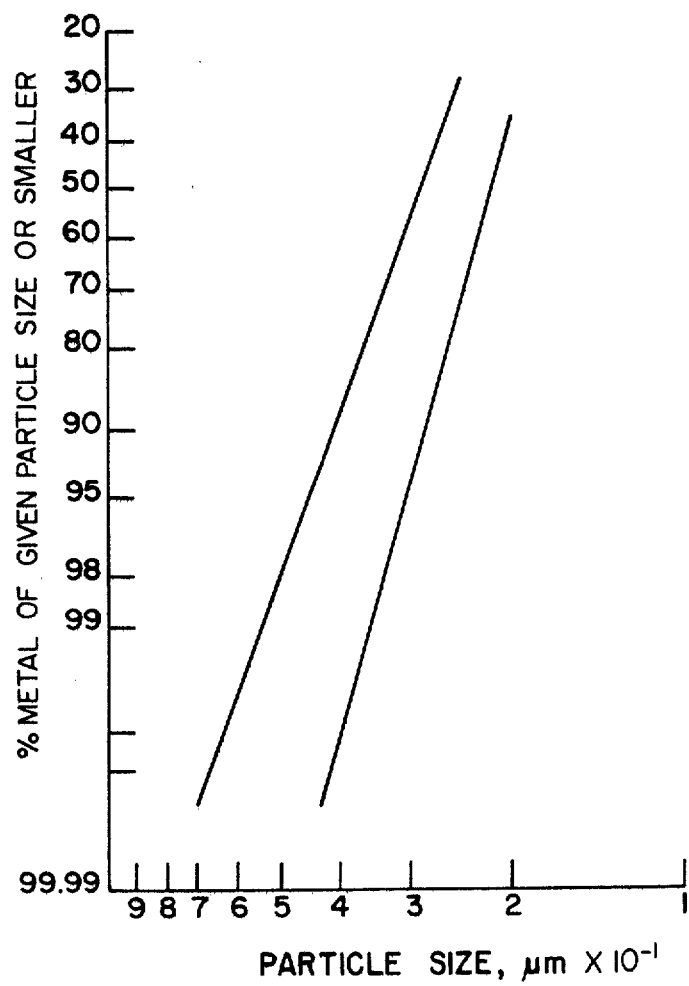
FIG. 3 is indicative of mesh size and particle size in two useful commercial products.

FIG. 2 illustrates still another metal-shielded transmission line 30 shielded according to the invention. This type, normally elliptical in basic configuration, comprises two inner conductors 32 embedded in a dielectric 34, then a metallic sheild 36. Over shield 36 is wrapped, helically, a web according to Example 2 comprising layers 38 of the radiation absorbing composition 38 on a polyester web 40 as described in Example 2. A protective jacket 42 covers the whole.

EXAMPLE 4

A quantity of 85 parts by weight of an iron powder of the type available under the trade designation Cobaloy 605 from the Cobaloy Company division of Graham Magnetics, Inc. was mixed with 15 parts of a polyurethane binder sold by Goodrich Chemicals Company under the trade designation Estane 5707. The iron powder was characterized by a thin layer of ohmic iron carbide thereover.

Tetrahydrofuran was utilized as a solvent vehicle in forming this mixture and thinning it to an appropriate coating viscosity in a laboratory shaker mill, a conventional piece of laboratory processing apparatus.

The resulting material was coated to a dry thickness of about 0.01 inches in one side of a 0.001 inch thick film of polyester substrate, i.e. the biaxially-oriented material sold by DuPont under the trade designation MYLAR. The coated web was dried and slit to a 0.5 inch width and then two turns were wound cylindrically onto the outer metallic shield of a coaxial transmission line characterized by an outer shield diameter of about 0.125 inch, with the coated side turned in to the outer shield. The result was a configuration similar to FIG. 2, except for an extra layer of polyester in place of the outer jacket (42).

The effectiveness of the EMI shielding was tested utilizing a 66 megahertz RF current to flow through a 6 inch section of the line:
Q prior to shielding: 255
Q with shielding: 24.5
Thus, 90.4% of the radiated power was absorbed.

Figure 4:
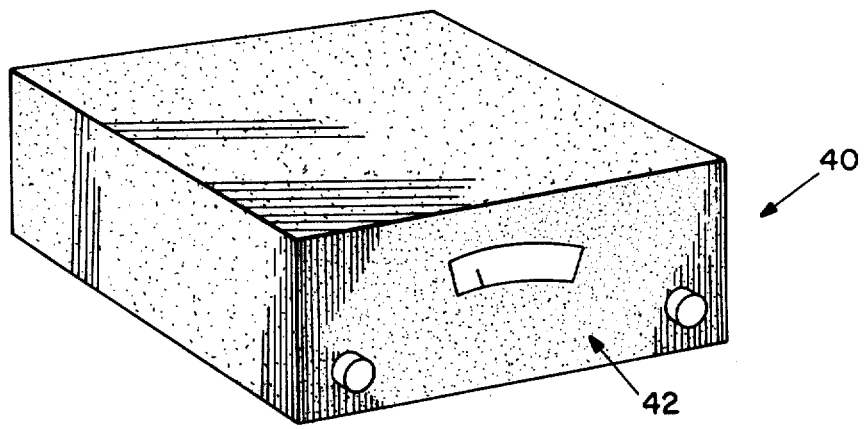
FIG. 4 is a schematic diagram of a radio-emitting device shielded with the shielding product of the invention.

FIG. 4 illustrates a radio device 40 comprising a interference reducing coating 42 designed to avoid interference in the range of $10^{7.5}$ to $10^{8.8}$ hertz range.

Figure 5:
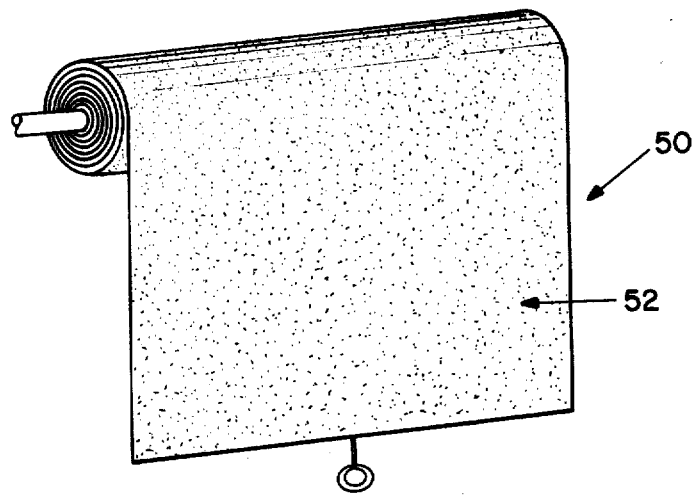
FIG. 5 is a schematic of a roller-type shielding device according to the invention.

FIG. 5 illustrates a roll-type radio-energy absorbing structure 50 formed with a composition 52 (as used in Example 2). A particular attribute of the device is that it can be rolled and unrolled many times without concern for breaking any particle-to-particle contact between the magnetic particles. (This is because the shielding action is largely attributable to magnetic rather than electro-conductive features). The roller device is particularly useful in forming lateral walls of radiation-shielded areas or doorways and windows in such areas.

It is also to be understood that the following claims are intended to cover all of the generic and specific features of the invention herein described and all statements of the scope of the invention which might be said to fall therebetween.

What is claimed is:

1. A flexible transmission line of the type utilized to transmit electric current in the frequency range of $10^6$ to $10^{10}$ hertz and comprising
   (a) an electrical conductor
   (b) electrical insulation around said conductor
   (c) a metallic sheathing around said electrical insulation
   and a coating means placed around said sheathing to absorb electromagnetic radiation emanating from said line, in the range of $10^6$ to $10^{10}$ hertz, said means being formed of a shielding composition comprising ferromagnetic particles of above 20 microns in average maximum dimension in a resin matrix and said coating means being of such thickness that it has no substantial interference with the flexibility of said transmission line.

2. A transmission line as described in claim 1 wherein said average maximum particle dimension is between 20 micrometers and 500 micrometers.

3. A transmission line as described in claim 2 wherein the division of said average maximum particle dimension in micrometers by the said shield thickness in inches gives a number of about 5000.

4. A transmission line as defined in claim 3 wherein said composition forming means to absorb electromagnetic radiation forms means to reduce Q for current in said metal sheathing by a factor of about 5 or more.

5. A transmission line as defined in claim 3 which transmission line is a coaxial cable.

6. A transmission line as defined in claim 3 wherein the volume conductivity of said composition is such that the skin depth factor thereof is from about 0.2 to 5 times the thickness of the coating means.

7. A transmission line as defined in claim 3 wherein said shielding composition is non-conductive.

8. A transmission line as defined in claim 3 wherein said composition forming means to absorb electromagnetic radiation forms means to reduce Q for current in said metal sheathing by a factor of about 5 or more.

9. A transmission line as defined in claim 2 wherein said particles are iron particles.

10. A transmission line as defined in claim 9 which transmission line is a coaxial cable.

11. A transmission line as defined in claim 9 wherein the volume conductivity of said composition is such that the skin depth factor thereof is from about 0.2 to 5 times the thickness of the coating means.

12. A transmission line as defined in claim 9 wherein said shielding composition is non-conductive.

13. A transmission line as defined in claim 2 wherein said particles are nickel particles.

14. A transmission line as defined in claim 13 which transmission line is a coaxial cable.

15. A transmission line as defined in claim 13 wherein the volume conductivity of said composition is such that the 16. A transmission lines as defined in claim 13 wherein said shielding composition is non-conductive.

17. A transmission line as described in claim 2 wherein said composition forming means to absorb electromagnetic radiation forms means to reduce Q for current in said metal sheathing by a factor of about 5 or more.

18. A transmission line as defined in claim 17 which transmission line is a coaxial cable.

19. A transmission line as defined in claim 17 wherein the volume conductivity of said composition is such that the skin depth factor thereof is from about 0.2 to 5 times the thickness of the coating means.

20. A transmission line as defined in claim 17 wherein said shielding composition is non-conductive.

21. A transmission line as defined in claim 2 wherein the volume conductivity of said composition is such that the skin depth factor thereof is from about 0.2 to 5 times the 22. A transmission line as defined in claim 2 wherein said shielding composition is non-conductive.

23. A transmission lines as defined in claim 1 wherein the volume conductivity of said composition is such that the skin depth factor thereof is from about 0.2 to 5 times the thickness of the coating means.

24. A transmission as defined in claim 1 wherein said composition forming means to absorb electromagnetic radiatin forms means to reduce Q for current in said metal sheathing by a factor of about 5 or more.

25. In electronic apparatus comprising a means to absorb the electromagnetic radiation in the range of $10^6$ hertz to $10^9$ hertz passing into or out of said apparatus, the improvement wherein said means to absorb is a thin coating comprising therein ferromagnetic metal particles having an average maximum dimension of from 38 micrometers to 50 micrometers.

26. A flexible, radiation-absorptive, sheet material comprising a flexible substrate and coated thereupon a flexible organic resin based coating comprising therein ferromagnetic metal particles having an av 27. A process for absorbing electromagnetic radiation in the frequency range of from about $10^7$ to $10^{10}$ hertz from a metal-shielded transmission line of the type transmitting at a frequency of from about $10^7$ to $10^{10}$ hertz, said process comprising the steps of overcoating said metal shield with a layer of a radiation-absorbing composition comprising small ferromagnetic particles dispersed in a resin matrix such that the volume conductivity of said composition is such that the skin depth factor is from about 0.2 to five times the thickness of said layer.

28. A process as defined in claim 27 wherein said particles are nickel, iron, or cobalt particles.

29. A process as described in claim 28 wherein said particles are ferromagnetic and have an average maximum particle dimension of between about 20 micrometers to about 500 micrometers.

30. A process as defined in claim 29 wherein said frequency range is from about $10^7$ hertz to about $10^8$ hertz and said maximum particle dimension is in a range of about from about 160 micrometers to 500 micrometers.

31. A process as defined in claim 30 wherein the Q factor at said transmitted frequency is reduced by a factor of 5 or more by said layer of radiation-absorbing composition comprising small magnetic particles dispersed in a resin matrix.

32. A process as defined in claim 30 wherein the principal wavelength of radiation to be absorbed is at least about 1/6 of the length of said transmission line and said transmission line is approximately an even multiple of half the wavelength of said radiation to be absorbed.

33. A process as defined in claim 30 wherein said layer of radiation-absorbing composition is nonconductive.

34. A process as defined in claim 29 wherein said frequency range is from about $10^8$ hertz to about $10^9$ hertz and said maximum particle dimension is within a range of about from about 50 micrometers to 160 micrometers.

35. A process as defined in claim 34 wherein the Q factor at said transmitted frequency is reduced by a factor of 5 or more by said layer of radiation-absorbing composition comprising small magnetic particles dispersed in a resin matrix.

36. A process as defined in claim 34 wherein the principal wavelength of radiation to be absorbed is at least about 1/6 of the length of said transmission line and said transmission line is approximately an even multiple of half the wavelength of said radiation to be absorbed.

37. A process as defined in claim 34 wherein said layer of radiation-absorbing composition is nonconductive.

38. A process as defined in claim 29 wherein said frequency range is from about $10^9$ hertz to about $10^{10}$ hertz and said average maximum particle dimension is between about 20 and about 50 micrometers.

39. A process as defined in claim 38 wherein the Q factor at said transmitted frequency is reduced by a factor of 5 or more by said layer of radiation-absorbing composition comprising small magnetic particles dispersed in a resin matrix.

40. A process as defined in claim 38 wherein the principal wavelength of radiation to be absorbed is at least about 1/6 of the length of said transmission line and said transmission line is approximately an even multiple of half the wavelength of said radiation to be absorbed.

41. A process as defined in claim 38 wherein said layer of radiation-absorbing composition is nonconductive.

42. A process as defined in claim 29 wherein the Q factor at said transmitted frequency is reduced by a factor of 5 or more by said layer of radiation-absorbing composition comprising small magnetic particles dispersed in a resin matrix.

43. A process as defined in claim 29 wherein the principal wavelength of radiation to be absorbed is at least about 1/6 of the length of said transmission line and said transmission line is approximately an even multiple of half the wavelength of said radiation to be absorbed.

44. A process as defined in claim 29 wherein said layer of radiation-absorbing composition is nonconductive.

45. A process as defined in claim 28 wherein the Q factor at said transmitted frequency is reduced by a factor of 5 or more by said layer of radiation-absorbing composition comprising small magnetic particles dispersed in a resin matrix.

46. A process as defined in claim 28 wherein the principal wavelength of radiation to be absorbed is at least about 1/6 of the length of said transmission line and said transmission line is approximately an even multiple of half the wavelength of said radiation to be absorbed.

47. A process as defined in claim 27 wherein the Q factor at said transmitted frequency is reduced by a factor of 5 or more by said layer of radiation-absorbing composition comprising small magnetic particles dispersed in a resin matrix.

48. A process as defined in claim 27 wherein the principal wavelength of radiation to be absorbed is at least about 1/6 of the length of said transmission line and said transmission line is approximately an even multiple of half the wavelength of said radiation to be absorbed.

* * * * *